(12) United States Patent
Takeishi (10) Patent No.: US 7,199,878 B2
(45) Date of Patent: Apr. 3, 2007

(54) SCAN EXPOSURE APPARATUS AND METHOD, AND DEVICE MANUFACTURING METHOD

(75) Inventor: Hiroaki Takeishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/128,219

(22) Filed: May 13, 2005

(65) Prior Publication Data

US 2005/0213098 A1    Sep. 29, 2005

Related U.S. Application Data

(62) Division of application No. 10/263,957, filed on Oct. 4, 2002, now Pat. No. 6,970,244.

(30) Foreign Application Priority Data

Oct. 5, 2001 (JP) ............................. 2001-310051

(51) Int. Cl.
*G01B 11/00* (2006.01)

(52) U.S. Cl. ...................... 356/399; 356/401
(58) Field of Classification Search ................... None
See application file for complete search history.

(56) References Cited

U.S. PATENT DOCUMENTS

| 5,365,051 | A | 11/1994 | Suzuki et al. ............. 250/201.2 |
| 5,737,063 | A | 4/1998 | Miyachi ........................ 355/53 |
| 5,754,299 | A | 5/1998 | Sugaya et al. .............. 356/401 |
| 5,757,149 | A | 5/1998 | Sato et al. .................... 318/135 |
| 5,883,701 | A | 3/1999 | Hasegawa et al. ............. 355/53 |
| 5,920,398 | A | 7/1999 | Iwanaga et al. ............. 356/401 |
| 5,933,215 | A | 8/1999 | Inoue et al. .................... 355/53 |
| 6,256,085 | B1 | 7/2001 | Takeishi ......................... 355/53 |
| 6,456,374 | B1 | 9/2002 | Takeishi .................... 356/237.3 |
| 6,462,828 | B1 | 10/2002 | Takeishi ...................... 356/509 |
| 6,531,706 | B2 | 3/2003 | Yamada et al. .......... 250/559.29 |
| 6,534,777 | B2 | 3/2003 | Yamada et al. .......... 250/559.29 |
| 6,559,465 | B1 | 5/2003 | Yamada et al. .......... 250/559.29 |
| 6,813,000 | B1 | 11/2004 | Nishi ........................... 355/53 |
| 6,963,075 | B2 | 11/2005 | Yamada et al. .......... 250/559.29 |
| 2003/0132401 | A1 | 7/2003 | Yamada et al. .............. 250/548 |

FOREIGN PATENT DOCUMENTS

| JP | 06-36991 | 2/1994 |
| JP | 09-92611 | 4/1997 |
| JP | 09-236425 | 9/1997 |
| JP | 9-246356 | 9/1997 |

(Continued)

OTHER PUBLICATIONS

Japanese Office Action dated Jul. 14, 2006, issued in corresponding Japanese patent application No. 2001-310051.

*Primary Examiner*—Michael P. Stafira
(74) *Attorney, Agent, or Firm*—Fitzpatrick, Cella, Harper & Scinto (57) ABSTRACT

A scan exposure apparatus according to this invention determines a scan velocity and a focus measurement position from process conditions and the like and determines a threshold Δ of the focus measurement position on the basis of the scan velocity. The scan exposure apparatus executes focus measurement if a stage position falls within the range of the threshold Δ.

8 Claims, 5 Drawing Sheets

FOREIGN PATENT DOCUMENTS

| | | |
|---|---|---|
| JP | 10-047915 | 2/1998 |
| JP | 10-83953 | 3/1998 |
| JP | 11-135411 | 5/1999 |
| JP | 2000-114161 | 4/2000 |
| JP | 2000-252192 | 9/2000 |

SCAN EXPOSURE APPARATUS AND METHOD, AND DEVICE MANUFACTURING METHOD

This application is a divisional application of patent application Ser. No. 10/263,957, filed on Oct. 4, 2002, now U.S. Pat. No. 6,970,244.

FIELD OF THE INVENTION

The present invention relates to a scan exposure apparatus and method, and a device manufacturing method.

BACKGROUND OF THE INVENTION

In recent years, an exposure apparatus is required to have a higher resolution with further miniaturization of a semiconductor element. To improve the resolution, a decrease in wavelength of an exposure light source or an increase in the projection optical system numerical aperture (NA) is demanded. Since the increase in NA increasingly reduces the depth of focus, still higher-accuracy exposure techniques are desired.

Conventionally, a step-and-repeat exposure apparatus (to be referred to as a "stepper" hereinafter) is employed as an exposure apparatus for the manufacturing process of a semiconductor device or the like. This exposure apparatus sequentially exposes a plurality of exposure regions on a wafer with the pattern of a master (reticle) via a projection optical system while moving the wafer stepwise. However, as the size of a wafer becomes large, and the integration degree of a semiconductor element increases, conventional steppers cannot cope with an increase in exposure area and pattern formation accuracy.

For this reason, the mainstream of exposure apparatuses has shifted from a conventional stepper to a step-and-scan exposure apparatus (to be referred to as a "scan exposure apparatus" hereinafter) which repeats exposure transfer operations in a plurality of regions on a wafer by repeatedly performing step movement and scanning exposure. In a scan exposure apparatus, a wafer and a reticle are respectively chucked by a wafer stage and a reticle stage, and exposure is performed while repeating scanning of both stages relative to each other.

There are two reasons why scan exposure apparatuses have come into wide use. The first reason is that each of them can perform exposure with a micropattern at high accuracy and at a wide field angle because its slit limits exposure light to the part relatively close to the optical axis of the projection optical system. The second reason is that it can perform fine focus driving in a shot because the wafer stage is driven using a plurality of focus measurement values at a plurality of points in a shot.

In the above scan exposure apparatus, focus measurement must inevitably be performed at a plurality of points during stage scanning. For this reason, it is particularly important to determine timings at which focus measurement operations are performed during stage scanning in different shots on a single wafer.

Figure 2:
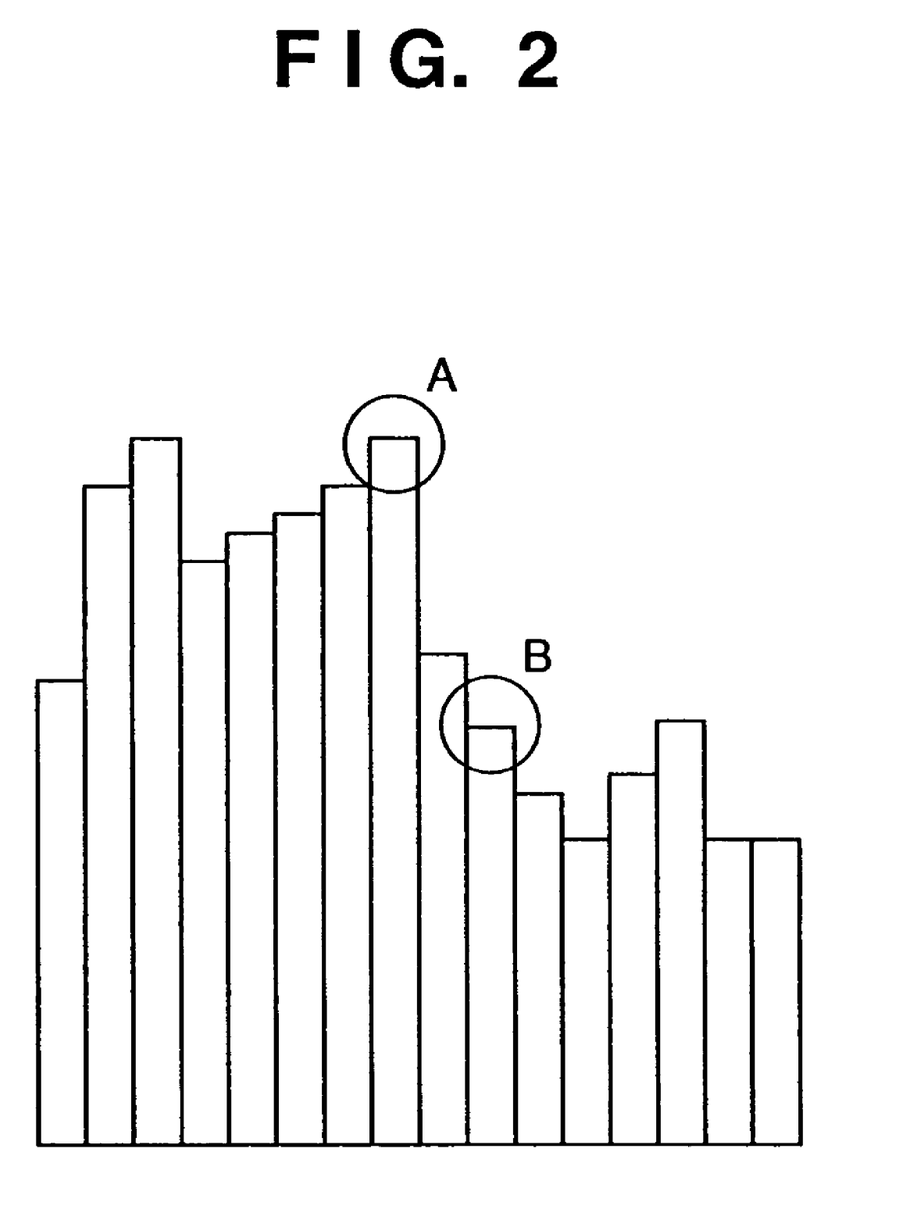
FIG. 2 is a graph schematically representing the stepped shape of a wafer.

For example, a semiconductor device is formed not by a single exposure operation but by exposing the same position a plurality of number of times using different reticles. Accordingly, to form a micropattern at high accuracy, focus measurement must be performed at the same position each time in a plurality of exposure processes. Assume that a wafer is processed to have a stepped shape as shown in FIG. 2 in the 1st to Nth exposure processes. In FIG. 2, the horizontal axis represents a position in a shot, and the vertical axis schematically represents the stepped shape of the wafer in the shot. At this time, assume that the timing of focus measurement during scanning at each shot in the (N+1)th exposure process shifts from those in the 1st to Nth focus exposure processes. In this case, focus driving is performed by, e.g., focus measurement of a B point instead of an A point, thereby exposing each shot at a position with a different offset relative to the exposure image plane. As a result, in a conventional exposure apparatus, such variations in exposure accuracy lead to a decrease in focusing accuracy, thereby reducing the yield of chips.

SUMMARY OF THE INVENTION

The present invention has been made in consideration of the above problems, and has as its object to, e.g., ensure measurement of the plane position of a substrate at a predetermined position on the substrate and improve the exposure accuracy.

According to the first aspect of the present invention, there is provided a scan exposure apparatus comprising a stage which moves while mounting a substrate thereon, a projection optical system which projects a pattern on the stage, a horizontal position measurement unit which measures a horizontal position of the stage, a measurement unit which measures a plane position of the substrate, and a controller which controls the stage so as to make an image plane of the projection optical system and a plane of the substrate coincide with each other on the basis of a measurement result by the measurement unit if a deviation of the horizontal position of the stage measured by the horizontal position measurement unit during scan exposure from a predetermined position falls within a tolerance.

According to a preferred embodiment of the present invention, the tolerance is preferably determined on the basis of a scan velocity of the stage.

According to a preferred embodiment of the present invention, the tolerance is preferably determined on the basis of a sampling frequency in measurement of the horizontal position of the stage by the horizontal position measurement unit.

According to a preferred embodiment of the present invention, the tolerance is preferably determined on the basis of the scan velocity of the stage, and the sampling frequency in measurement of the horizontal position of the stage by the horizontal position measurement unit.

According to a preferred embodiment of the present invention, the controller preferably determines the tolerance on the basis of the scan velocity of the stage.

According to a preferred embodiment of the present invention, the controller preferably determines the tolerance on the basis of the sampling frequency in measurement of the horizontal position of the stage by the horizontal position measurement unit.

According to a preferred embodiment of the present invention, the controller preferably determines the tolerance on the basis of the scan velocity of the stage, and the sampling frequency in measurement of the horizontal position of the stage by the horizontal position measurement unit.

According to a preferred embodiment of the present invention, the controller preferably causes the measurement unit to measure the plane position of the substrate if the deviation of the horizontal position of the stage measured by the horizontal position measurement unit during scan exposure from the predetermined position falls within the tolerance.

According to a preferred embodiment of the present invention, the controller preferably corrects the predetermined position on the basis of a time lag from a time when the horizontal position measurement unit measures the horizontal position of the stage to a time when the controller determines whether a deviation of a measurement result by the horizontal position measurement unit from the predetermined position falls within the tolerance.

According to a preferred embodiment of the present invention, the controller preferably corrects the predetermined position on the basis of a scanning direction of the stage.

According to the second aspect of the present invention, there is provided a scan exposure method in an exposure apparatus having a stage which moves while mounting a substrate thereon, a projection optical system which projects a pattern on the stage, a horizontal position measurement unit which measures a horizontal position of the stage, and a measurement unit which measures a plane position of the substrate. The method comprises the control step of controlling the stage so as to make an image plane of the projection optical system and a plane of the substrate coincide with each other on the basis of a measurement result by the measurement unit if a deviation of the horizontal position of the stage measured by the horizontal position measurement unit during scan exposure from a predetermined position falls within a tolerance.

According to the third aspect of the present invention, there is provided a device manufacturing method comprising the steps of applying a photosensitive agent to a substrate, printing a pattern on the substrate by using the scan exposure apparatus of the present invention, and developing the substrate.

According to the fourth aspect of the present invention, there is provided a device manufacturing method comprising the steps of applying a photosensitive agent to a substrate, printing a pattern on the substrate by using the scan exposure method of the present invention, and developing the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention will be described below with reference to the accompanying drawings.

Figure 3:
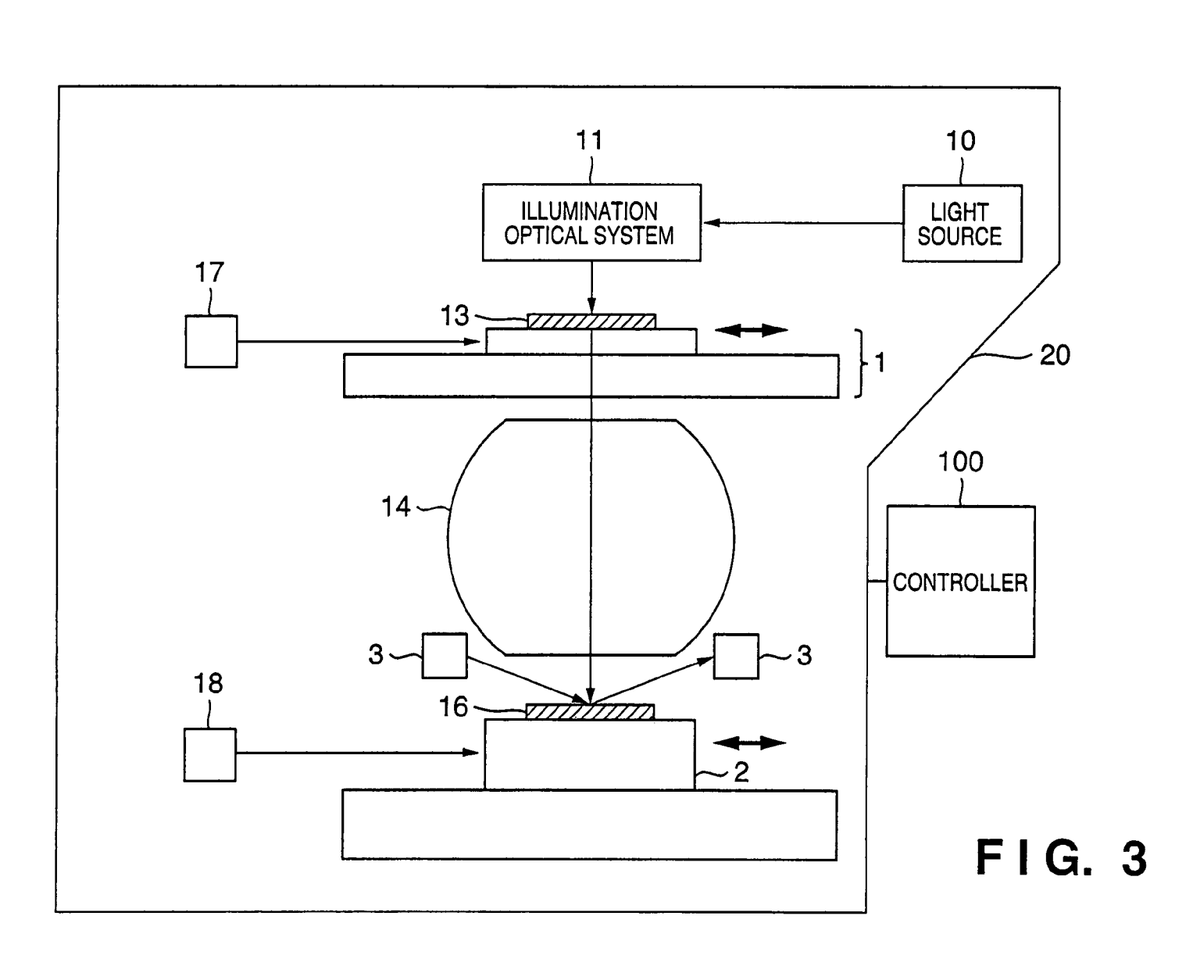
FIG. 3 is a view showing the schematic arrangement of the scan exposure apparatus according to the preferred embodiment of the present invention.

FIG. 3 is a view showing the schematic arrangement of a scan exposure apparatus 20 according to the preferred embodiment of the-present invention. Light emitted from a light source 10 is shaped in an illumination optical system 11 and then passes through a slit having a width of about several mm. A master (reticle) 13, which is held on a reticle stage (mask stage) 1, is irradiated with the light. Though a KrF excimer laser is often employed as the light source 10, the present invention is not limited to this. Light having passed through a projection optical system 14 reaches a wafer 16 as a substrate held on a wafer stage (substrate stage) 2. At this time, the wafer stage 2 and reticle stage 1 are moved in opposite directions at a constant speed, thereby obtaining an exposure field with a width larger than that of the slit. The wafer stage 2 and reticle stage 1 are moved in the opposite directions because the projection optical system 14 inverts images.

The horizontal positions of the reticle stage 1 and wafer stage 2 are precisely measured respectively using laser interferometric measuring units 17 and 18 as horizontal position measuring devices. As for the vertical direction, the relative distance between the position of the plane (plane position) of the wafer 16 and the exposure image plane is detected by focus measurement units 3. A controller 100 drives the wafer stage 2 on the basis of focus measurement values from the focus measurement units 3 so as to make the plane of the wafer 16 coincide with the exposure image plane. This scan exposure apparatus is controlled by the controller 100.

Figure 1:
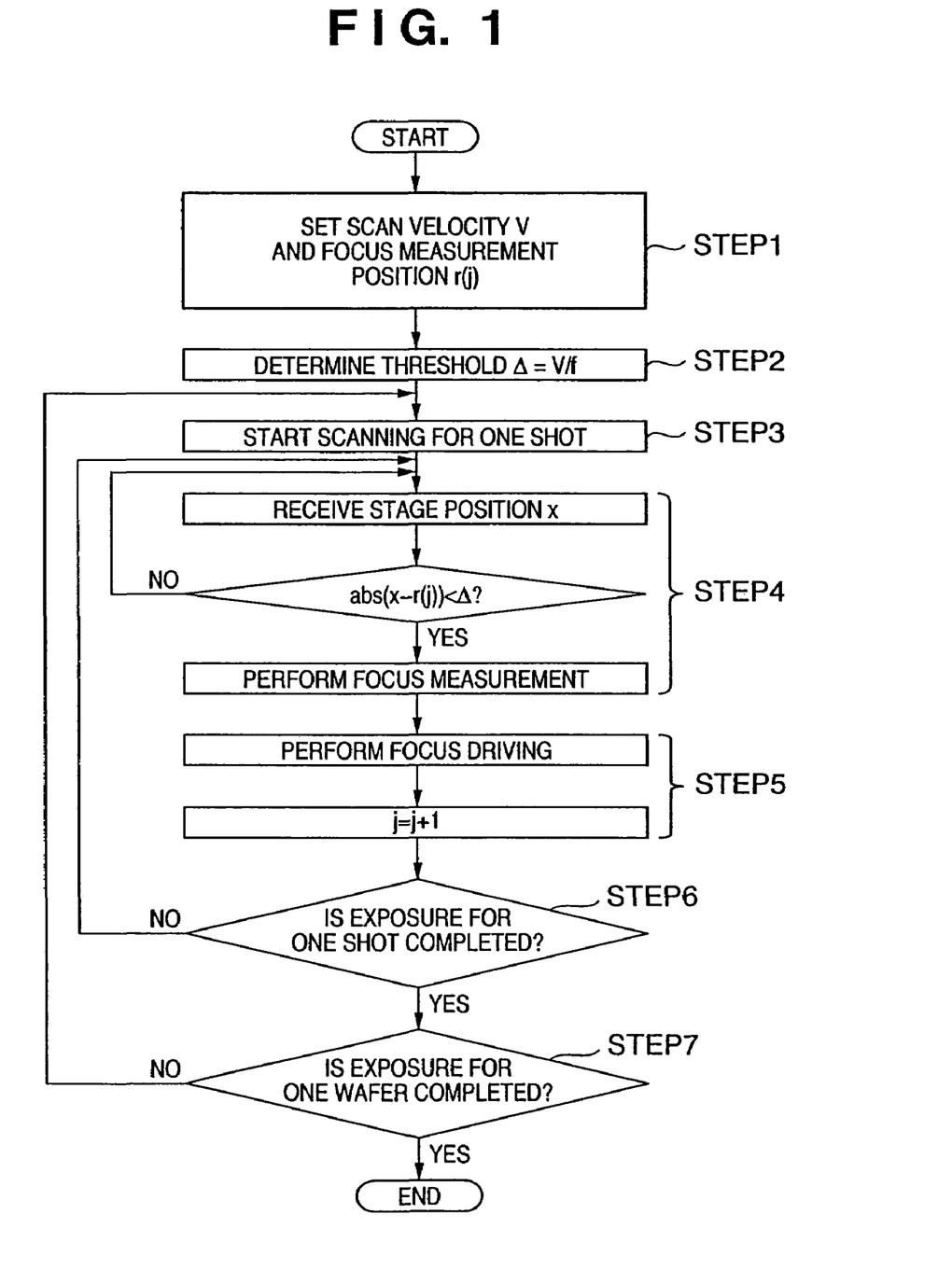
FIG. 1 is a flow chart showing the operation of a scan exposure apparatus according to a preferred embodiment of the present invention.

FIG. 1 is a flow chart showing the operation of a scan exposure apparatus 20 according to the preferred embodiment of the present invention shown in FIG. 3. The scan exposure apparatus 20 is controlled by the controller 100. Note that the controller 100 may be integrated into the scan exposure apparatus 20 or may be separately provided.

In step 1, the controller 100 determines the exposure amount and a scan velocity V on the basis of set process conditions such as the resist sensitivity and the like. In this step, the controller 100 also determines a position r(j) as a focus measurement target within a chip.

In step 2, the controller 100 determines a threshold Δ (e.g., Δ=V/f), which meets the condition shown in inequality (1) below, on the basis of the scan velocity V determined in step 1:

$$\Delta \geq V/f \qquad (1)$$

where Δ represents a threshold for use in subsequent steps; V, a scan velocity of the wafer stage 2 and/or master 13; and f, a sampling frequency in measurement and control of the position of the wafer stage 2. Inequality (1) provides the condition for preventing a point as a focus measurement target from passing through the detection regions of the focus measurement units 3 during the period between the Nth stage position sampling and (N+1)th stage sampling by the laser interferometric measuring unit 18. The controller 100 can control focus measurement at any scan velocity V such that it is performed in the vicinity of the stage position as a focus measurement target by setting the threshold Δ on the basis of the scan velocity V. Consequently, the focus measurement units 3 can always perform focus measurement at almost the same point within each of a plurality of shots in a wafer.

In step 3, the controller 100 controls the scan exposure apparatus 20 to start scan exposure.

In step 4, the laser interferometric measuring unit 18 measures a horizontal position x of the wafer stage 2, and the controller 100 controls the scan exposure apparatus 20 to perform focus measurement only if the obtained horizontal position x of the wafer stage 2 meets the condition given by inequality (2) below:

$$abs(x-r(j))<\Delta \qquad (2)$$

where abs( ) represents a function of calculating the absolute value of a value within ( ); x, a focus measurement position which indicates a sampled stage position; and r(j), the horizontal position of the wafer stage 2 as a focus measurement target. Inequality (2) provides the condition for which a deviation abs(x-r(j)) of the horizontal position x of the wafer stage 2 measured by the laser interferometric measuring unit 18 during scan exposure from a predetermined position r(j) falls within a tolerance (threshold Δ). If the condition given by inequality (2) holds, the focus measurement units 3 perform focus measurement. On the other hand, if the condition does not hold, the flow returns to the start of step 4, and the laser interferometric measuring unit 18 measures the stage position x again.

In step 5, the controller 100 drives the wafer stage 2 in the vertical direction on the basis of a focus value measured in step 4 and causes the plane of the wafer 16 to coincide with the image plane of the projection optical system 14. At this time, the controller 100 increments j by 1 and sets the horizontal position r(j) of the wafer stage 2 as a focus measurement target.

In step 6, the controller 100 determines whether or not exposure for one shot is complete. If exposure for one shot is not complete, steps 4 and 5 are repeated. On the other hand, if exposure for one shot is complete, the flow advances to step 7.

In step 7, the controller 100 determines whether or not exposure for one wafer (all shots) is complete. If it is not complete, steps 3 to 6 are repeated for the next shot. Otherwise, the series of processes ends.

The stage position is preferably sampled by a digital control system which controls the wafer stage 2. However, in many cases, determination in step 4 cannot be performed until a certain period of time passes with respect to a reference clock which defines a sampling frequency. Generally, the digital control system repeats the following processes for each sampling:

(1) generating an interrupt at the leading edge of a reference clock pulse;

(2) receiving a measurement value such as the stage position at the start of an interrupt cycle; and (3) performing a control operation and other calculations. More specifically, the stage position is latched at the leading edge of a reference clock pulse and used for the determination in step 4. However, since the wafer stage 2 moves at a constant speed during a short period of time to this determination, a distance by which the wafer stage 2 moves can be an error. In addition, since scan exposure is performed while the wafer stage 2 repeats a reciprocating motion, the sign of this error may invert depending on the scanning direction. Consequently, the error becomes twice as large as its magnitude.

Under the circumstances, step 4' using inequality (3) as a conditional expression may effectively be employed instead of the conditional expression of step 4.

In step 4', focus measurement is performed only if the horizontal position x of the wafer stage 2 meets the condition given by inequality (3) below in the Nth sampling:

$$abs(x+(dt*V)*dir-r(j))<\Delta \qquad (3)$$

where x represents the sampled horizontal position of the wafer stage 2; r(j), the horizontal position of the wafer stage 2 as a focus measurement target; dir, a scanning direction (+1 or −1); and dt, a time lag from the leading edge of a reference clock pulse to a determination of whether or not the condition of inequality (3) holds. This can reduce the above-described errors. The time lag dt may be calculated from the number of steps in software. Alternatively, the time lag dt may be calculated by using a timer which operates in accordance with another clock having a higher frequency than the reference clock and is so set as to be cleared at the leading edge of a reference clock pulse to read the value of the timer upon the determination in step 4'. With this operation, errors which may occur in the digital control system can be suppressed. For this reason, in a scan exposure apparatus using a digital control system, measurement of the plane position of the substrate at a predetermined position on the substrate can be ensured. This can further improve the exposure accuracy.

A typical example of a sensor used for focus measurement includes, e.g., a CCD. In this case, a method is adopted in which a mark (pattern) is formed on a wafer using, e.g., an LED light source or the like, and a CCD detects a reflected image of the mark on the wafer. The CCD needs some time to store an electrical charge due to its operation principle. When focus measurement is to be performed while scanning, the wafer is measured while moving for this storage time. Let T be the storage time, and V be the scan velocity. In this case, the center of a region under measurement deviates from a position as a focus measurement target by V*T/2. As a result, points which deviate from each other by V×T are measured between shots to be scanned in opposite directions.

In this case, step 4" using inequality (4) below as a conditional expression is effectively employed instead of steps 4 and 4'.

In step 4", focus measurement is performed only if the horizontal position x of the wafer stage 2 meets the condition given by inequality (4) below in the Nth sampling:

$$abs(x+(dt+T)*V)*dir-r(j))<\Delta \qquad (4)$$

With this operation, measurement errors due to a sensor for focus measurement can be reduced. Accordingly, measurement of the plane position of a substrate at a predetermined position on the substrate by the sensor can be ensured. This can further improve the exposure accuracy of a scan exposure apparatus.

An example of a semiconductor device manufacturing method using the above-described scan exposure apparatus will be explained next.

Figure 4:
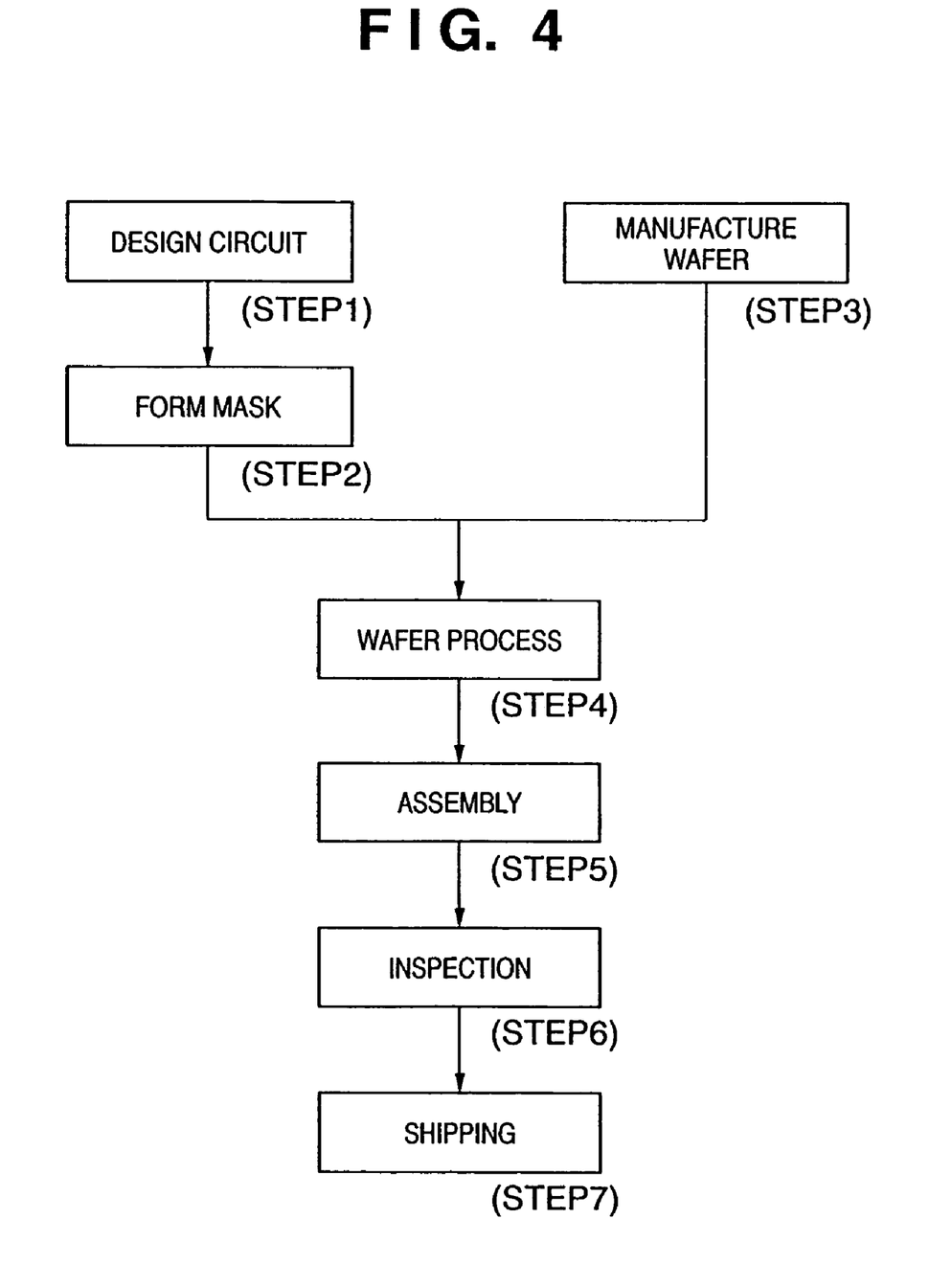
FIG. 4 is a flow chart showing the manufacturing process of a semiconductor device.

FIG. 4 shows the flow of the manufacturing process of the semiconductor device (e.g., a semiconductor chip, such as an IC or LSI, a liquid crystal panel, a CCD, or the like).

In step 1 (circuit design), a semiconductor device circuit is designed. In step 2 (mask formation), a mask having the designed circuit pattern is formed. In step 3 (wafer formation), a wafer is formed by using a material such as silicon. In step 4 (wafer process) called a pre-process, an actual circuit is formed on the wafer by lithography using the prepared mask and wafer. Step 5 (assembly) called a post-process is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 5:
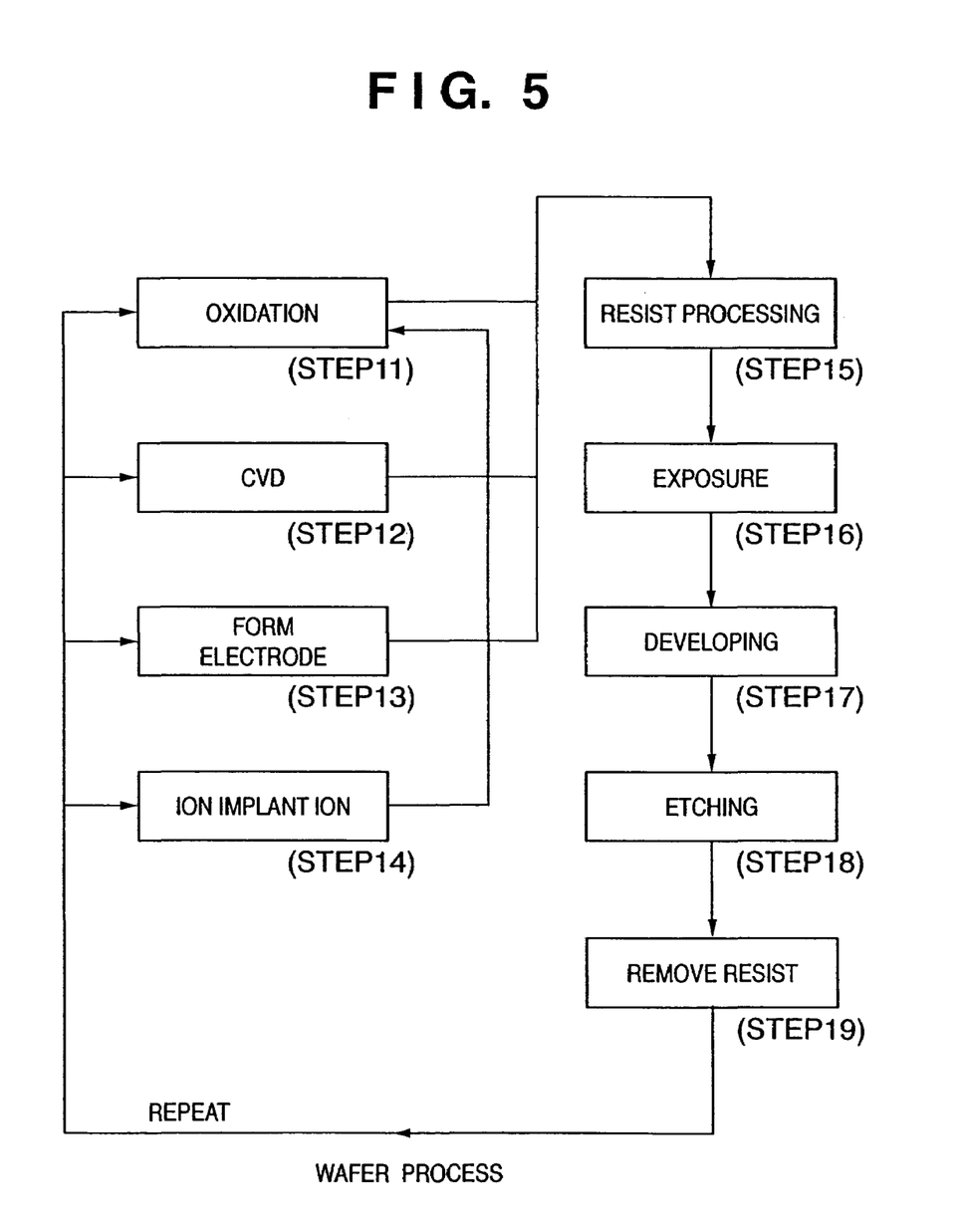
FIG. 5 is a chart for explaining the wafer process.

FIG. 5 shows the detailed flow of the wafer process.

In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask, and prints the circuit pattern on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

According to this manufacturing method, when each of stacked multiple patterns is to be scanned and exposed, focus measurement is performed in almost the same position in the plane direction of a wafer. Accordingly, each pattern is exposed within the depth of focus of a projection optical system at high accuracy. Therefore, high-performance semiconductor devices can be manufactured with high yield.

According to the present invention, measurement of the plane position of a substrate at a predetermined position on the substrate is ensured, thereby improving the exposure accuracy.

As many apparently widely different embodiments of the present invention can be made without departing from the spirit and scope thereof, it is to be understood that the invention is not limited to the specific embodiments thereof except as defined in the appended claims.

What is claimed is:

1. A scan exposure apparatus comprising:
a stage which moves while mounting a substrate thereon;
a projection optical system which projects a pattern on the substrate;
a horizontal position measurement unit which measures a horizontal position of said stage;
a measurement unit which measures a surface position of the substrate; and
a controller which causes said measurement unit to measure the surface position of the substrate if the deviation of the horizontal position of said stage measured by said horizontal position measurement unit during scan exposure from a predetermined horizontal position of said stage falls within a tolerance,
wherein the tolerance is determined on the basis of a scan velocity of said stage.

2. A scan exposure apparatus comprising:
a stage which moves while mounting a substrate thereon;
a projection optical system which projects a pattern on the substrate;
a horizontal position measurement unit which measures a horizontal position of said stage;
a measurement unit which measures a surface position of the substrate; and
a controller which causes said measurement unit to measure the surface position of the substrate if the deviation of the horizontal position of said stage measured by said horizontal position measurement unit during scan exposure from a predetermined horizontal position of said stage falls within a tolerance,
wherein the tolerance is determined on the basis of a sampling frequency in measurement of the horizontal position of said stage by said horizontal position measurement unit.

3. A scan exposure apparatus comprising:
a stage which moves while mounting a substrate thereon;
a projection optical system which projects a pattern on the substrate;
a horizontal position measurement unit which measures a horizontal position of said stage;
a measurement unit which measures a surface position of the substrate; and
a controller which causes said measurement unit to measure the surface position of the substrate if the deviation of the horizontal position of said stage measured by said horizontal position measurement unit during scan exposure from a predetermined horizontal position of said stage falls within a tolerance,
wherein the tolerance is determined on the basis of the scan velocity of said stage, and the sampling frequency in measurement of the horizontal position of said stage by said horizontal position measurement unit.

4. A scan exposure apparatus comprising:
a stage which moves while mounting a substrate thereon;
a projection optical system which projects a pattern on the substrate;
a horizontal position measurement unit which measures a horizontal position of said stage;
a measurement unit which measures a surface position of the substrate; and
a controller which causes said measurement unit to measure the surface position of the substrate if the deviation of the horizontal position of said stage measured by said horizontal position measurement unit during scan exposure from a predetermined horizontal position of said stage falls within a tolerance,
wherein said controller determines the tolerance on the basis of the scan velocity of said stage.

5. A scan exposure apparatus comprising:
a stage which moves while mounting a substrate thereon;
a projection optical system which projects a pattern on the substrate;
a horizontal position measurement unit which measures a horizontal position of said stage;
a measurement unit which measures a surface position of the substrate; and
a controller which causes said measurement unit to measure the surface position of the substrate if the deviation of the horizontal position of said stage measured by said horizontal position measurement unit during scan exposure from a predetermined horizontal position of said stage falls within a tolerance,
wherein said controller determines the tolerance on the basis of the sampling frequency in measurement of the horizontal position of said stage by said horizontal position measurement unit.

6. A scan exposure apparatus comprising:
a stage which moves while mounting a substrate thereon;
a projection optical system which projects a pattern on the substrate;

a horizontal position measurement unit which measures a horizontal position of said stage;

a measurement unit which measures a surface position of the substrate; and a controller which causes said measurement unit to measure the surface position of the substrate if the deviation of the horizontal position of said stage measured by said horizontal position measurement unit during scan exposure from a predetermined horizontal position of said stage falls within a tolerance, wherein said controller determines the tolerance on the basis of the scan velocity of said stage, and the sampling frequency in measurement of the horizontal position of said stage by said horizontal position measurement unit.

7. A scan exposure apparatus comprising:

a stage which moves while mounting a substrate thereon;

a projection optical system which projects a pattern on the substrate;

a horizontal position measurement unit which measures a horizontal position of said stage;

a measurement unit which measures a surface position of the substrate; and a controller which causes said measurement unit to measure the surface position of the substrate if the deviation of the horizontal position of said stage measured by said horizontal position measurement unit during scan exposure from a predetermined horizontal position of said stage falls within a tolerance, wherein said controller corrects the predetermined horizontal position on the basis of a time lag from a time when said horizontal position measurement unit measures the horizontal position of said stage to a time when said controller determines whether a deviation of a measurement result by said horizontal position measurement unit from the predetermined horizontal position falls within the tolerance.

8. A scan exposure apparatus comprising:

a stage which moves while mounting a substrate thereon;

a projection optical system which projects a pattern on the substrate;

a horizontal position measurement unit which measures a horizontal position of said stage;

a measurement unit which measures a surface position of the substrate; and a controller which causes said measurement unit to measure the surface position of the substrate if the deviation of the horizontal position of said stage measured by said horizontal position measurement unit during scan exposure from a predetermined horizontal position of said stage falls within a tolerance, wherein said controller corrects the predetermined position on the basis of a scanning direction of said stage.

* * * * *